(12) United States Patent
Sinitsky et al.

(10) Patent No.: US 7,323,379 B2
(45) Date of Patent: Jan. 29, 2008

(54) FABRICATION PROCESS FOR INCREASED CAPACITANCE IN AN EMBEDDED DRAM MEMORY

(75) Inventors: Dennis Sinitsky, Los Gatos, CA (US); Fu-Chieh Hsu, Saratoga, CA (US)

(73) Assignee: MoSys, Inc., Sunnyvale, CA (US)

( * ) Notice: Subject to any disclaimer, the term of this patent is extended or adjusted under 35 U.S.C. 154(b) by 0 days.

(21) Appl. No.: 11/050,988

(22) Filed: Feb. 3, 2005
(Under 37 CFR 1.47)

(65) Prior Publication Data
US 2006/0172504 A1 Aug. 3, 2006

(51) Int. Cl.
*H01L 21/8238* (2006.01)
(52) U.S. Cl. ............... 438/210; 438/427; 257/E21.548
(58) Field of Classification Search ............... 438/210, 438/221, 427; 257/E21.548
See application file for complete search history.

(56) References Cited

U.S. PATENT DOCUMENTS

| | | | |
|---|---|---|---|
| 5,198,995 A | 3/1993 | Dennard et al. |
| 5,267,201 A | 11/1993 | Foss et al. |
| 5,297,104 A | 3/1994 | Nakashima |
| 5,371,705 A | 12/1994 | Nakayama et al. |
| 5,377,139 A | 12/1994 | Lage et al. |
| 5,394,365 A | 2/1995 | Tsukikawa |
| 5,416,034 A | 5/1995 | Bryant |
| 5,449,636 A | 9/1995 | Park et al. |
| 5,600,598 A | 2/1997 | Skjaveland et al. |
| 5,694,355 A | 12/1997 | Skjaveland et al. |
| 5,703,827 A | 12/1997 | Leung et al. |
| 5,789,291 A | 8/1998 | Sung |
| 5,863,819 A | 1/1999 | Gonzalez |

(Continued)

FOREIGN PATENT DOCUMENTS

DE          3543937          6/1986

(Continued)

OTHER PUBLICATIONS

Gillingham et al. "A 768k Embedded DRAM for 1.244Gb/s ATM Switch in a 0.8um Logic Process", 1996 IEEE Int'l. Solid-State Circuits Conf. (2pgs).

(Continued)

*Primary Examiner*—Chandra Chaudhari
(74) *Attorney, Agent, or Firm*—Bever, Hoffman & Harms, LLP; E. Eric Hoffman, Esq.

(57) ABSTRACT

An embedded memory system includes an array of dynamic random access memory (DRAM) cells, which are isolated with deep trench isolation, and logic transistors, which are isolated with shallow trench isolation. Each DRAM cell includes an access transistor and a capacitor structure. The capacitor structure is fabricated by forming a metal-dielectric-semiconductor (MOS) capacitor in a deep trench isolation region. A cavity is formed in the deep trench isolation, thereby exposing a sidewall region of the substrate. The sidewall region is doped, thereby forming one electrode of the cell capacitor. A gate dielectric layer is formed over the exposed sidewall, and a polysilicon layer is deposited over the resulting structure, thereby filling the cavity. The polysilicon layer is patterned to form the gate electrode of the access transistor and a capacitor electrode, which extends over the sidewall region and upper surface of the substrate.

17 Claims, 14 Drawing Sheets

U.S. PATENT DOCUMENTS

| | | |
|---|---|---|
| 5,963,838 A | 10/1999 | Yamamoto et al. |
| 5,986,947 A | 11/1999 | Choi et al. |
| 5,999,474 A | 12/1999 | Leung et al. |
| 6,002,606 A | 12/1999 | Komatsu |
| 6,009,023 A | 12/1999 | Lu et al. |
| 6,104,055 A | 8/2000 | Watanabe |
| 6,147,914 A | 11/2000 | Leung et al. |
| 6,333,532 B1 | 12/2001 | Davari et al. |
| 6,352,890 B1 | 3/2002 | Sutcliffe |
| 6,406,976 B1 * | 6/2002 | Singh et al. ............... 438/423 |
| 6,468,855 B2 | 10/2002 | Leung et al. |
| 6,492,224 B1 | 12/2002 | Jao |
| 7,019,348 B2 * | 3/2006 | Tu ............................. 438/427 |
| 2002/0053691 A1 | 5/2002 | Leung et al. |

FOREIGN PATENT DOCUMENTS

| | | |
|---|---|---|
| DE | 4034169 | 5/1991 |
| EP | 460694 | 12/1991 |
| EP | 493659 | 7/1992 |
| EP | 632462 | 1/1995 |
| JP | 60113461 | 6/1985 |
| JP | 01150353 | 6/1989 |
| JP | 03136275 | 6/1991 |
| JP | 3259566 | 11/1991 |
| JP | 7094596 | 4/1995 |
| JP | 8063964 | 3/1996 |
| WO | WO 01/01450 | 1/2001 |

OTHER PUBLICATIONS

Hashimoto et al. "An Embedded DRAM Module using a Dual Sense Amplifier Architecture in a Logic Process", 1997 IEEE Int'l. Solid-State Circuits Conf. (3 pgs).

Gray et al. "Chap 4-Transistor Current Sources and Active Loads", Analysis And Design Of Analog Integrated Circuits, pp. 330-333, no date.

* cited by examiner

FABRICATION PROCESS FOR INCREASED CAPACITANCE IN AN EMBEDDED DRAM MEMORY

RELATED APPLICATIONS

The present application is related to commonly-owned U.S. Pat. No. 6,642,098 issued on Jun. 6, 2003, and commonly-owned U.S. Pat. No. 6,573,548 issued in Nov. 4, 2003.

BACKGROUND OF THE INVENTION

1. Field of the Invention

The present invention relates to dynamic random access memory (DRAM). Moreover, the present invention relates to DRAM fabricated by slightly modifying a conventional one-transistor static random access memory (1T-SRAM-Q) process, which in turn is a slight modification of a conventional logic process.

2. Related Art

FIG. 1 shows a schematic of a conventional DRAM cell 1 that is fabricated using a conventional logic process. As used herein, a conventional logic process is defined as a semiconductor fabrication process that uses only one layer of polysilicon and provides for either a single-well or twin-well structure. DRAM cell 1 consists of p-channel MOS access transistor 2 (referred to here as pass gate), p-channel MOS transistor 3, word line electrode 4 (which is coupled to the gate terminal of access transistor 2), and bit line electrode 5 (which is coupled to the drain terminal of access transistor 2). P-channel transistor 3 is configured to operate as a charge-storage capacitor, with the source and drain of this transistor 3 being commonly connected. P-channel transistor 3 is hereinafter referred to as a cell capacitor.

FIGS. 2A-2D are cross sectional views illustrating an embedded DRAM process flow resulting in the manufacture of an array of DRAM cells (identical to DRAM cell 1) in memory array region 10 and conventional logic devices in logic region 11. As shown in FIGS. 2A-2D, the array of DRAM cells are fabricated side-by-side on the same chip with conventional logic devices.

As shown in FIG. 2A, a mask layer 1200 is formed over p-type substrate 1000. A photoresist mask 1300 is formed over mask layer 1200 as illustrated. The openings in photoresist mask 1300 define the locations of subsequently formed shallow trench isolation (STI) structures.

As shown in FIG. 2B, an etch is performed through photoresist mask 1300, thereby removing the exposed portions of mask layer 1200. Photoresist mask 1300 is stripped, and a shallow trench etch is then performed to a depth $D_{STI}$ through the patterned mask layer 1200.

As shown in FIG. 2C, patterned mask layer 1200 is removed, n-type well region 1100 is formed, the trenches formed in FIG. 2B are filled with a STI dielectric 120, such as $SiO_2$. STI dielectric 120, which has a depth $D_{STI}$, is used to isolate active circuitry, including logic gates and memory cells. Another patterned mask layer 1320 is formed over the resulting structure. Patterned mask layer 1320 includes an opening, which exposes a portion of n-well region 1100 and STI dielectric 120 as illustrated. An etch is performed through this opening, thereby removing a portion of the exposed STI dielectric 120, and exposing a sidewall section of the trench. As described below, this etch allows the formation of a folded capacitor structure. This folded capacitor structure saves cell area while still maintaining large capacitance, thereby allowing the resulting DRAM memory cell to operate properly. STI dielectric 120 maintains a thickness $T_1$ at the bottom of the trench. The remaining thickness $T_1$ of the recessed STI region is thick enough to prevent formation of an inversion layer directly under the recessed region, thereby isolating memory cells adjacent to the recessed STI dielectric 120.

A P− type implant is performed through the opening of patterned mask layer 1320, thereby forming P− doped layer 140 in well region 1100. Note that N-well 1100 isolates the array memory cells from other circuits on the die and from the large body of substrate 1000, therefore improving noise immunity and soft-error-rate of the memory.

As shown in FIG. 2D, patterned mask layer 1320 is removed, and processing continues with the formation of gate dielectric layers 130-131, conductive elements 101, 100A, 100B and 100C (with adjacent sidewall spacers), P− regions 150, 160 and 161, P+ regions 170-171, metal salicide regions 180-181, and salicide blocking layer 190. In one embodiment, conductive elements 101, 100A, 100B and 100C are formed over gate dielectric 130-131 using the conventional logic process polysilicon layer. Salicide regions 180-181 are simultaneously formed in both memory and logic areas, thereby forming high-performance transistors. It is desirable to exclude salicide from the charge storage regions 150 and 140; therefore, salicide blocking layer 190 is used to prevent salicide formation in these regions. Logic devices formed in area 11 also contain conventional logic LDD and source/drain diffusions 161 and 171, respectively.

Conductive element 100A forms a gate electrode of a p-channel transistor corresponding with access transistor 2 (FIG. 1). Gate dielectric 130, salicide layer 180, P+ diffusion region 170 and P− diffusion regions 150 and 160 form the remaining elements of this access transistor. Salicide layer 180 and P+ diffusion region 170 provide reduced contact resistance for an associated bit line (not shown). P− type layer 140 and conductive element 100B are separated by gate dielectric 130, thereby forming a capacitor corresponding with cell capacitor 3 (FIG. 1). P− diffusion region 150 couples the access transistor to MOS capacitor 3. The cell capacitor stores charge in an inversion layer in the substrate located under conductive element 100B. This inversion layer is formed by applying a large negative voltage to capacitor gate 100B.

Although FIG. 2D only illustrates PMOS logic devices, it is understood that NMOS logic devices outside of N-well 1100 are also part of the integrated circuit.

The fabrication process of FIGS. 2A-2D is described in more detail in connection with FIGS. 3G-3S of U.S. Pat. Nos. 6,642,098 and 6,573,548. Hereafter, this fabrication process is referred to as the "1T-SRAM-Q process".

The conventional 1T-SRAM-Q memory process shown in FIGS. 2A-2D has one major shortcoming. Namely, as the technology scales in sub-90 nm dimensions, the STI thickness ($D_{STI}$) gradually decreases. At the same time, the thickness $T_1$ cannot arbitrarily decrease because this thickness is required to prevent cross-cell leakage within the process variation of memory cell parameters. It is therefore challenging to maintain acceptable cell capacitance, which enables proper DRAM memory read operations, as technology scales.

It would therefore be desirable to have an embedded DRAM process, which resolves the above-described capacitance scaling limitation.

SUMMARY

Accordingly, the present invention provides an improved method of forming an embedded DRAM system including DRAM cells and logic transistors on the same semiconductor substrate, wherein each of the DRAM cells includes an access transistor and a capacitor structure. The method includes forming a plurality of shallow trenches having a first depth in a logic area of the substrate, and forming a plurality of deep trenches having a second depth, greater than the first depth, in a memory array area of the substrate. Dielectric material is deposited in the shallow trenches, thereby forming shallow trench isolation regions, which isolate logic transistors in the logic region. Similarly, dielectric material is deposted in the deep trenches, thereby forming deep trench isolation regions, which isolate DRAM cells in the memory array region.

Cavities are etched in the deep trench isolation regions, thereby exposing sidewall regions of the substrate. A dopant can optionally be implanted into the exposed sidewall regions, thereby creating inversion regions in the exposed sidewall regions. A dielectric layer, which forms the capacitor dielectric of the DRAM cell capacitors, is formed over the exposed sidewall regions. A conductive layer, such as polysilicon, is deposited over the dielectric layer, filling the cavities etched in the deep trench isolation regions. This conductive layer is patterned, thereby forming electrodes of the cell capacitors, gate electrodes of the access transistors, and gate electrodes of the logic transistors. The deep trench isolation regions enable a large capacitor area in a relatively small layout area, while maintaining the required isolation thickness T1 at the bottom of the deep trench.

The shallow trenches and the deep trenches can be formed in various manners in different embodiments of the present invention. For example, an intermediate depth etch, having a depth equal to the second depth minus the first depth, can be performed in locations where the deep trenches are to be formed. Subsequently, a shallow depth etch, having a depth equal to the first depth, can be performed in locations where both the shallow and deep trenches are to be formed.

In another example, a shallow depth etch, having a depth equal to the first depth, can be performed in locations where both the shallow and deep trenches are to be formed. Subsequently, an intermediate depth etch, having a depth equal to the second depth minus the first depth, can be performed in locations where the deep trenches are to be formed.

In yet another example, a shallow depth etch, having a depth equal to the first depth, can be performed in locations where the shallow trenches are to be formed. A deep etch, having a depth equal to the second depth, can be performed in locations where the deep trenches are to be formed.

The present invention will be more fully understood in view of the following description and drawings.

DETAILED DESCRIPTION

Figure 1:
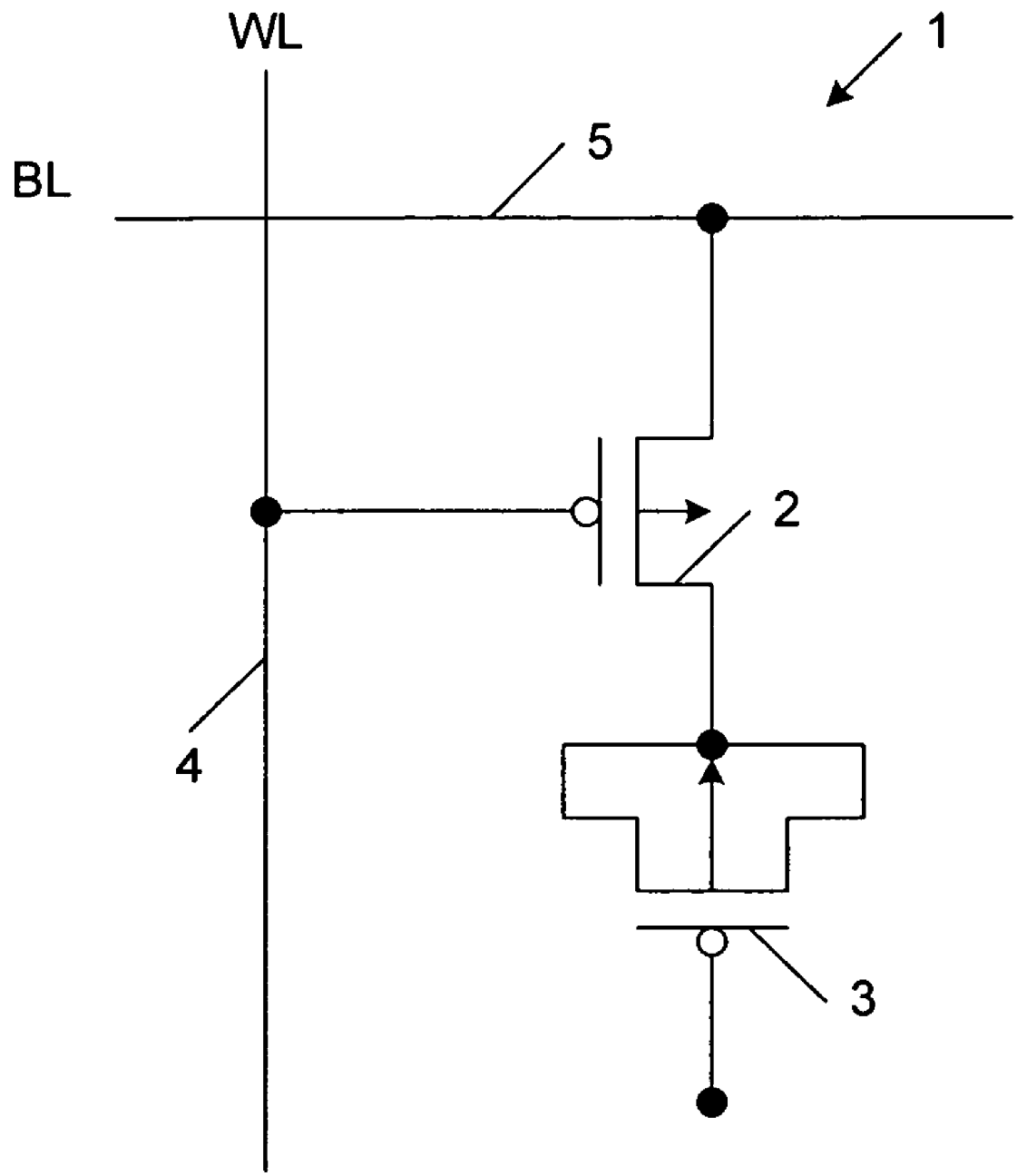
FIG. 1 shows a schematic of a conventional DRAM cell that is fabricated using a conventional logic process.
Figure 2A:
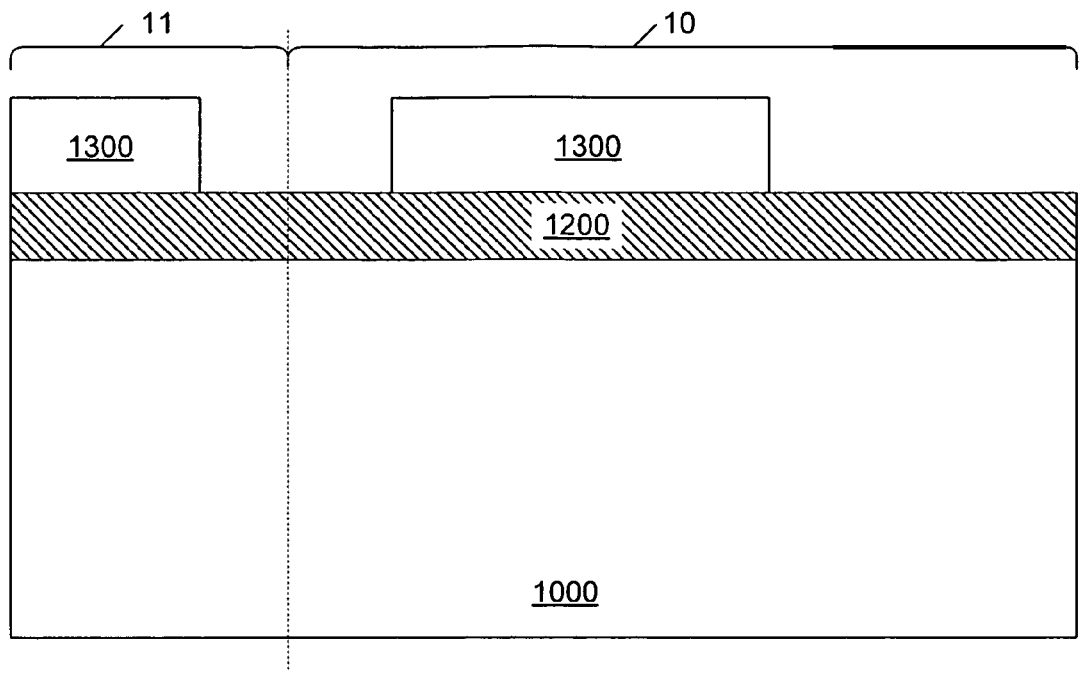
FIGS. 2A-2D are cross sectional views illustrating an embedded DRAM process flow resulting in the manufacture of an array of DRAM cells in a memory array region, and conventional logic devices in a logic region.
Figure 2B:
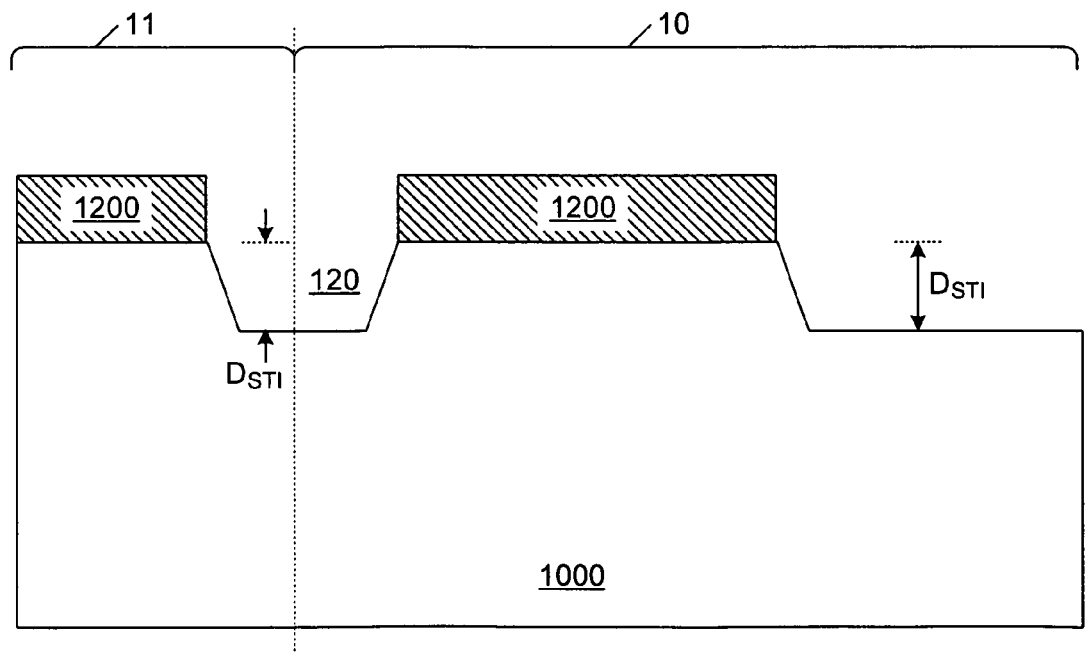
Figure 2C:
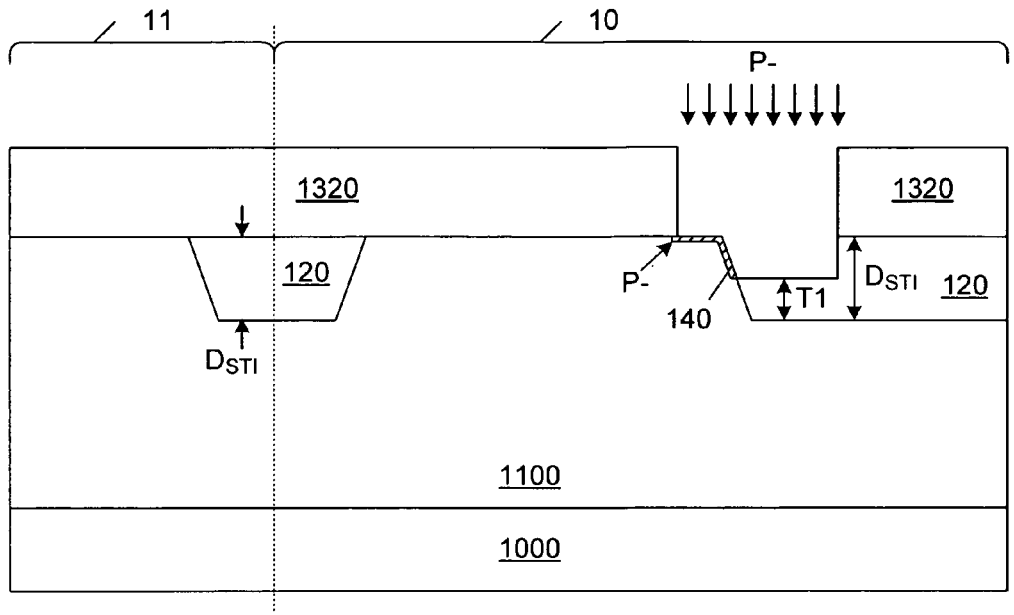
Figure 2D:
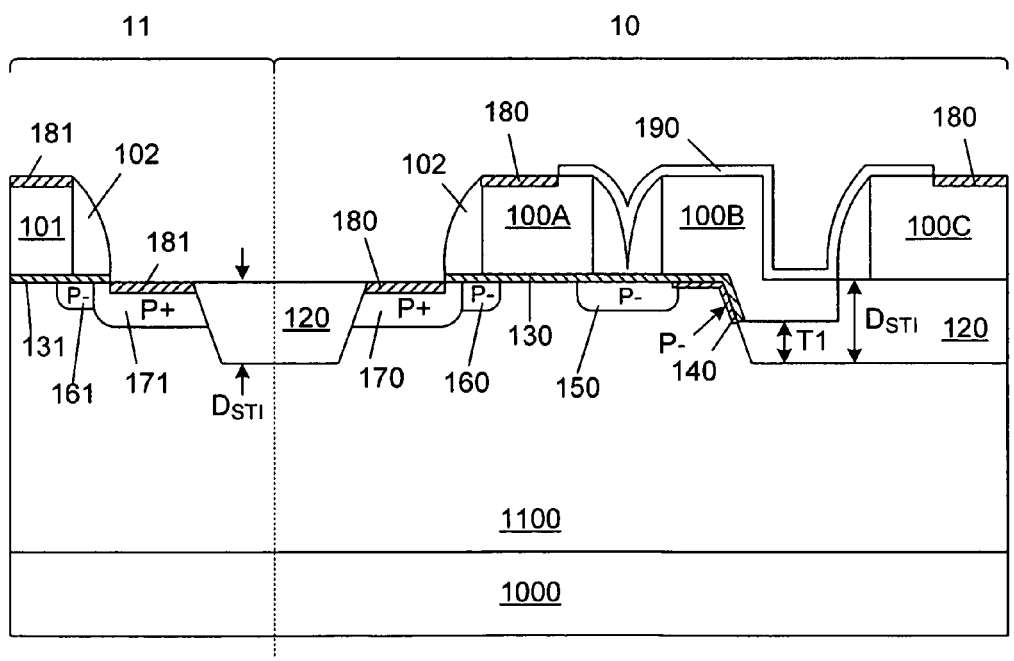

The present invention provides a memory system that includes DRAM cells consistent with the circuit schematic of FIG. 1, along with conventional logic transistors fabricated on the same chip. These DRAM cells and logic transistors are fabricated by slightly modifying a conventional logic process or the 1T-SRAM-Q process.

Figure 3A:
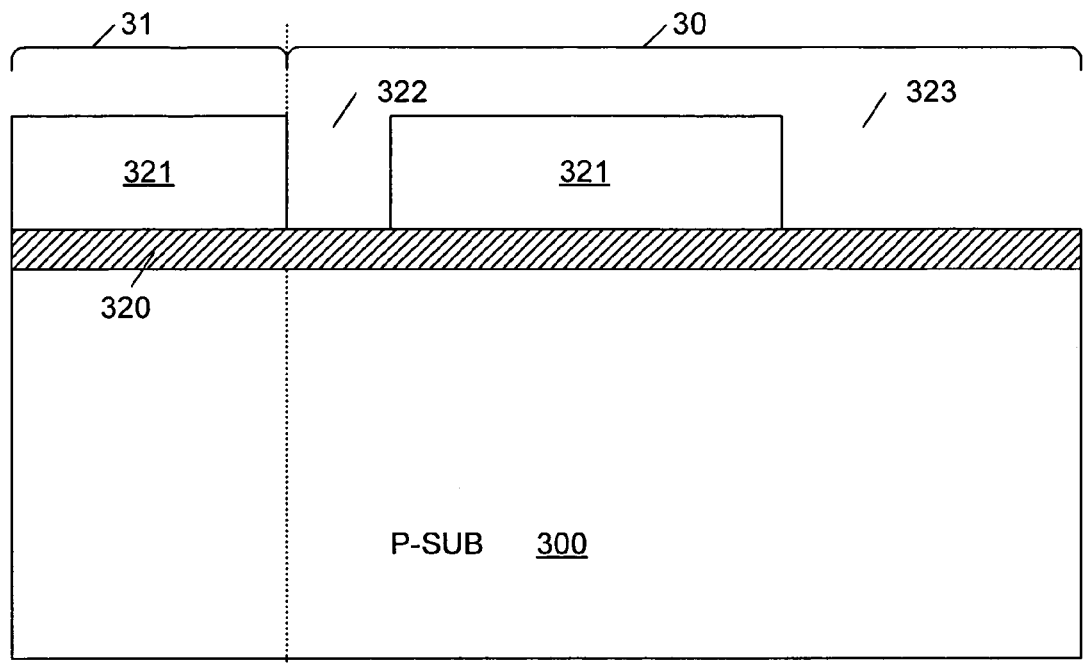
FIGS. 3A-3P are cross sectional views of a DRAM cell and a conventional logic transistor during various states of fabrication in accordance with one embodiment of the present invention.
Figure 3B:
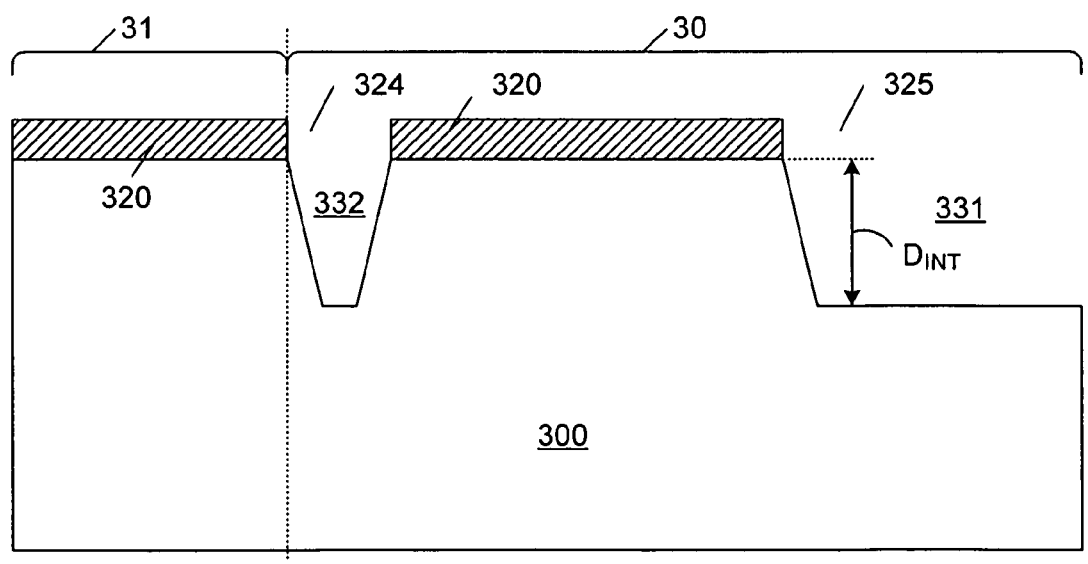
FIG. 3Q is a top view of an array of DRAM cells, formed using the process flow of FIGS. 3A-3P, in accordance with one embodiment of the present invention.
Figure 3C:
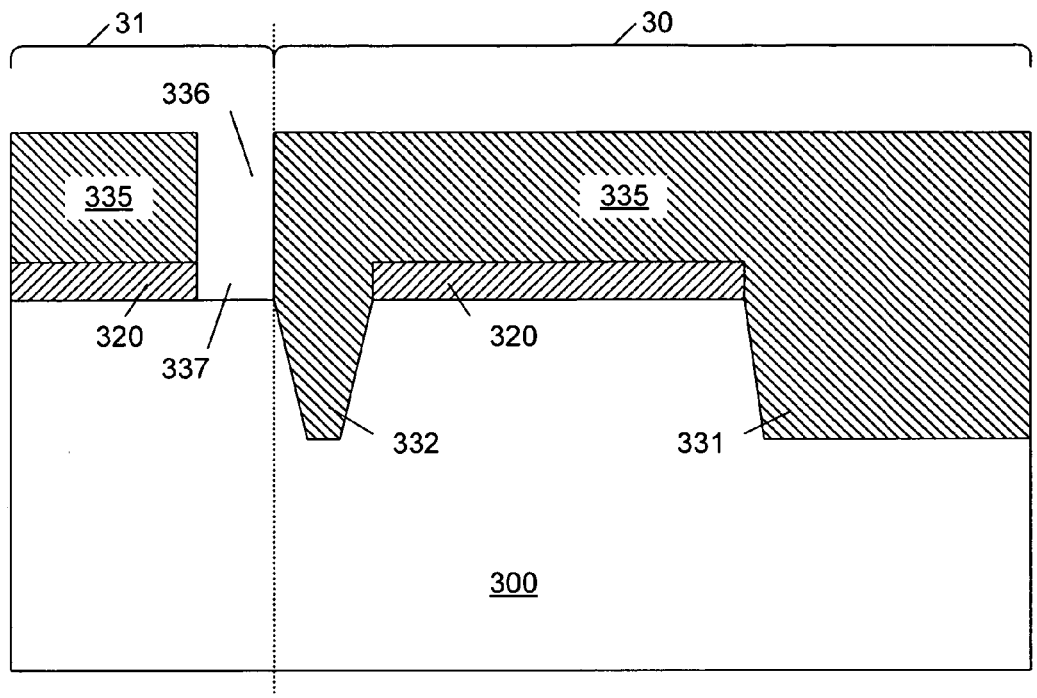
Figure 3D:
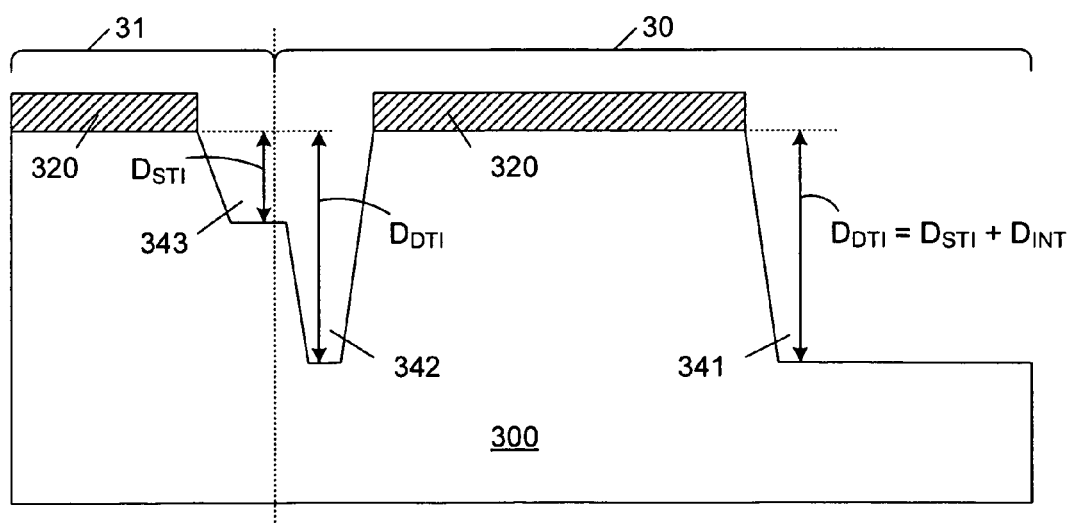
Figure 3E:
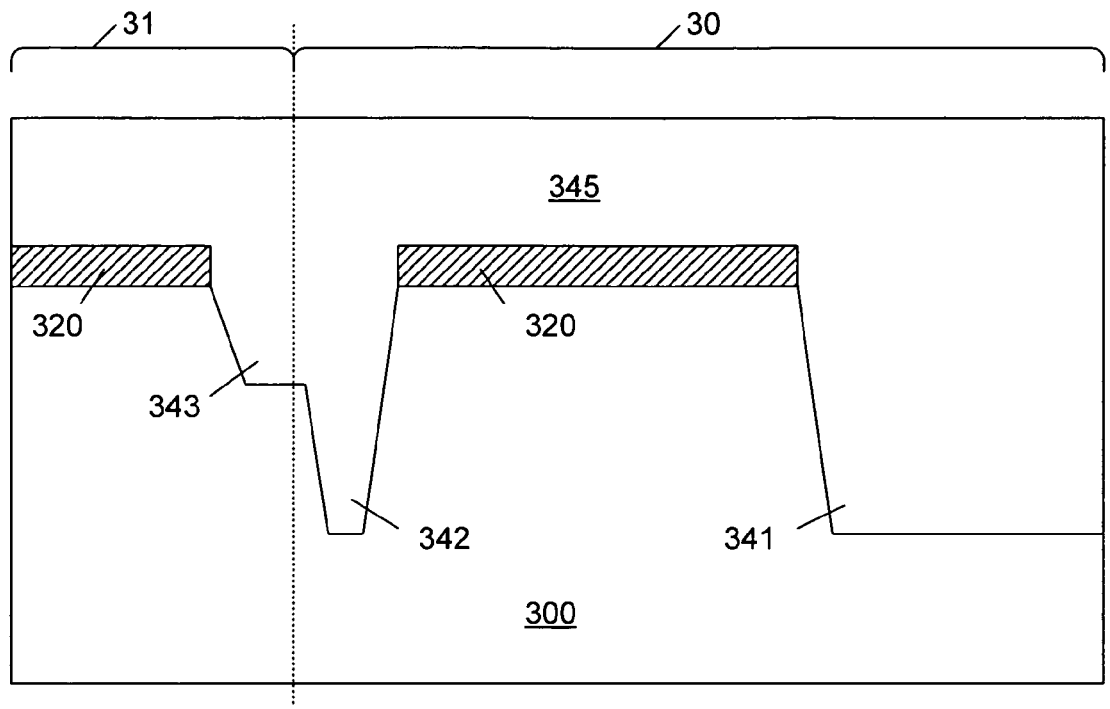
Figure 3F:
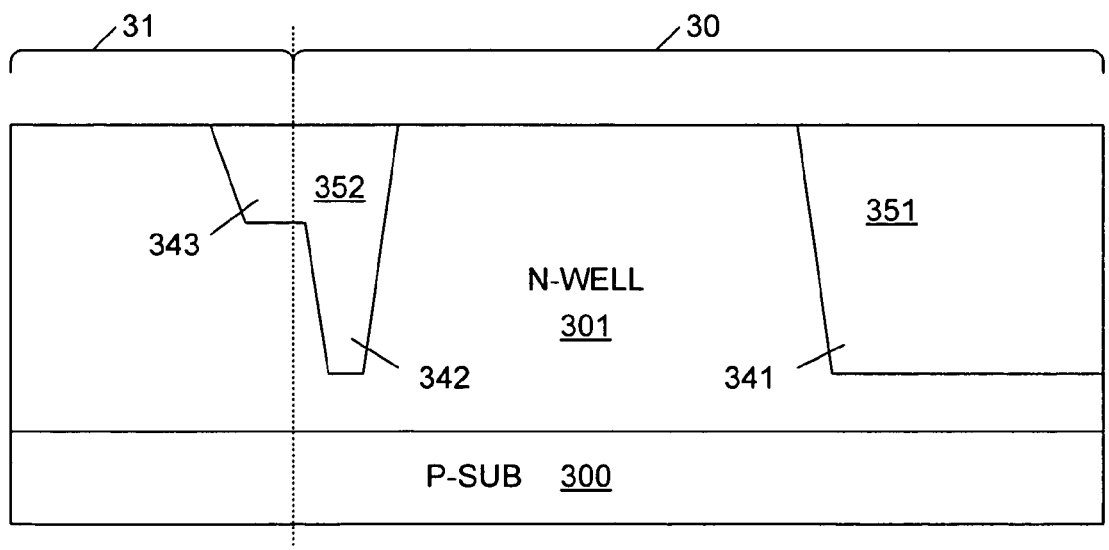
Figure 3G:
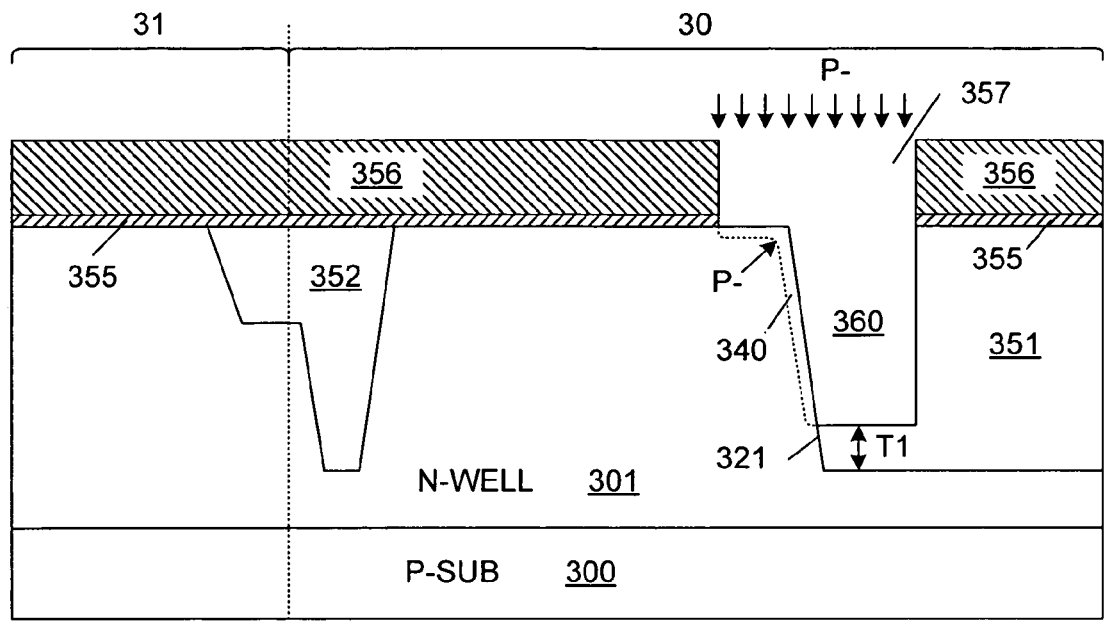
Figure 3H:
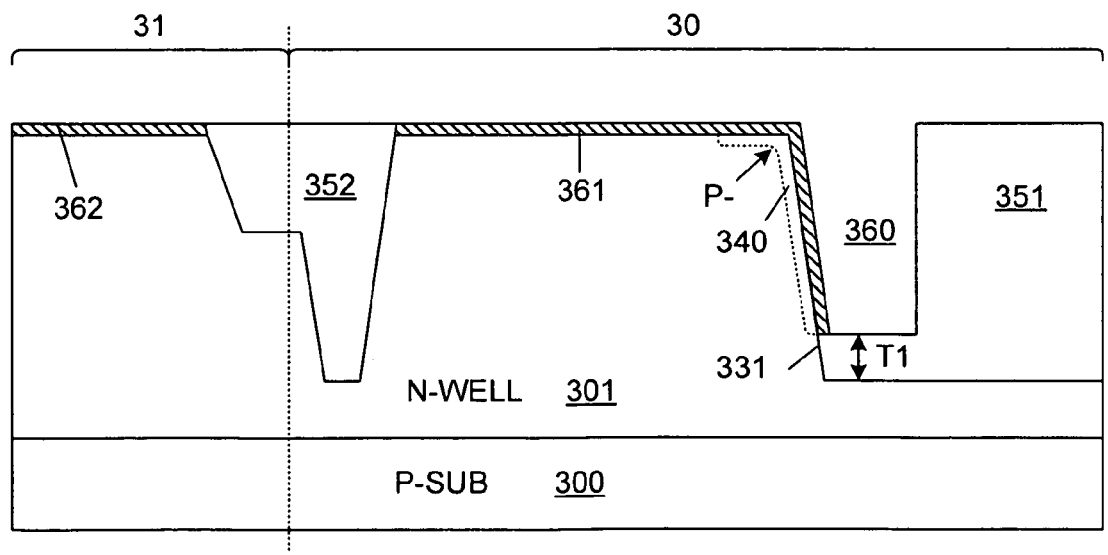
Figure 3I:
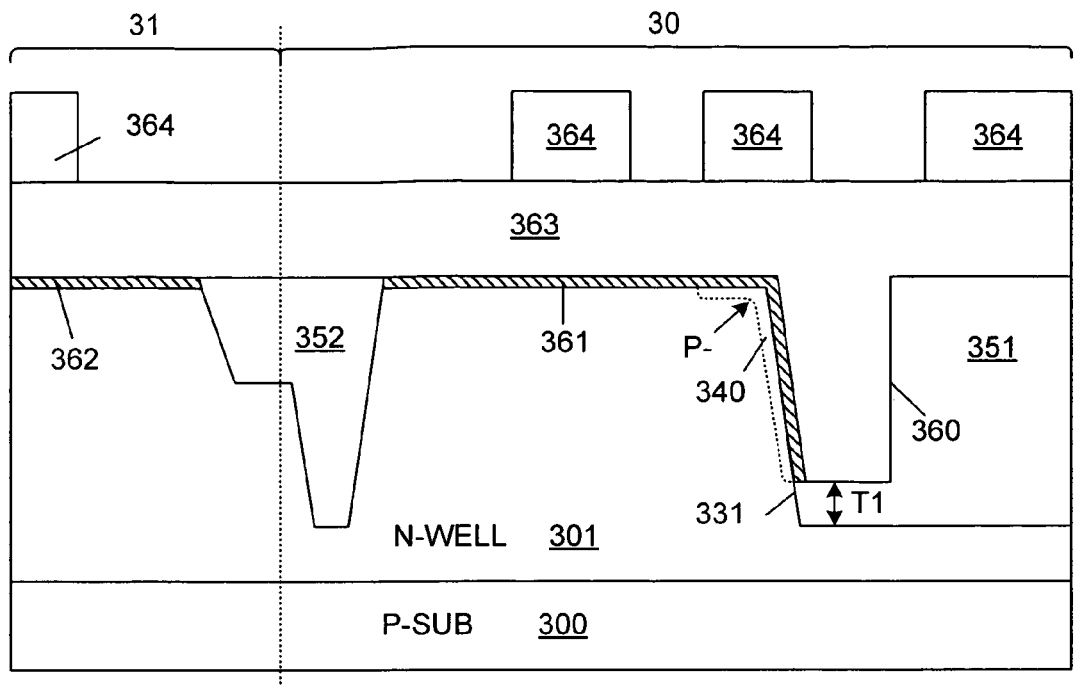
Figure 3J:
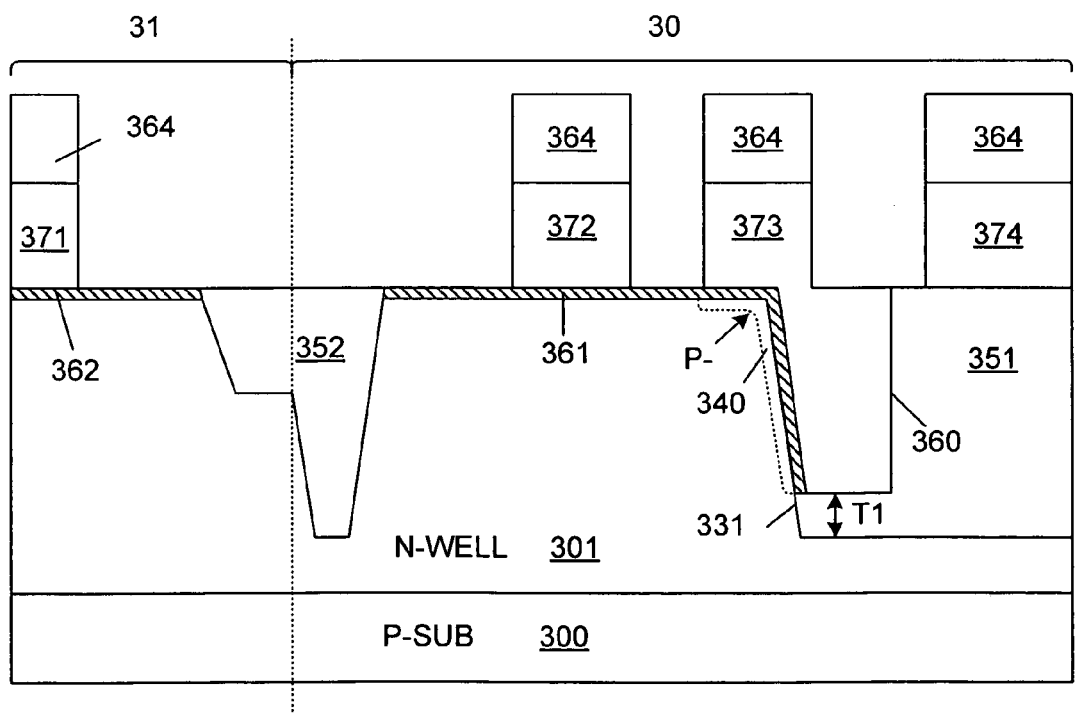
Figure 3K:
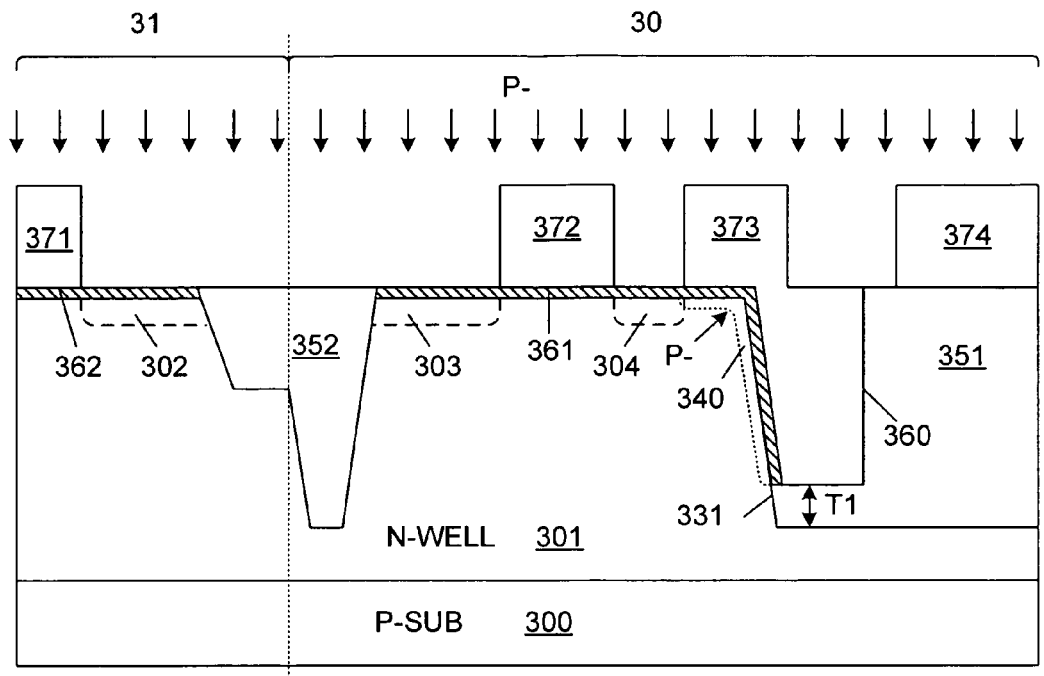
Figure 3L:
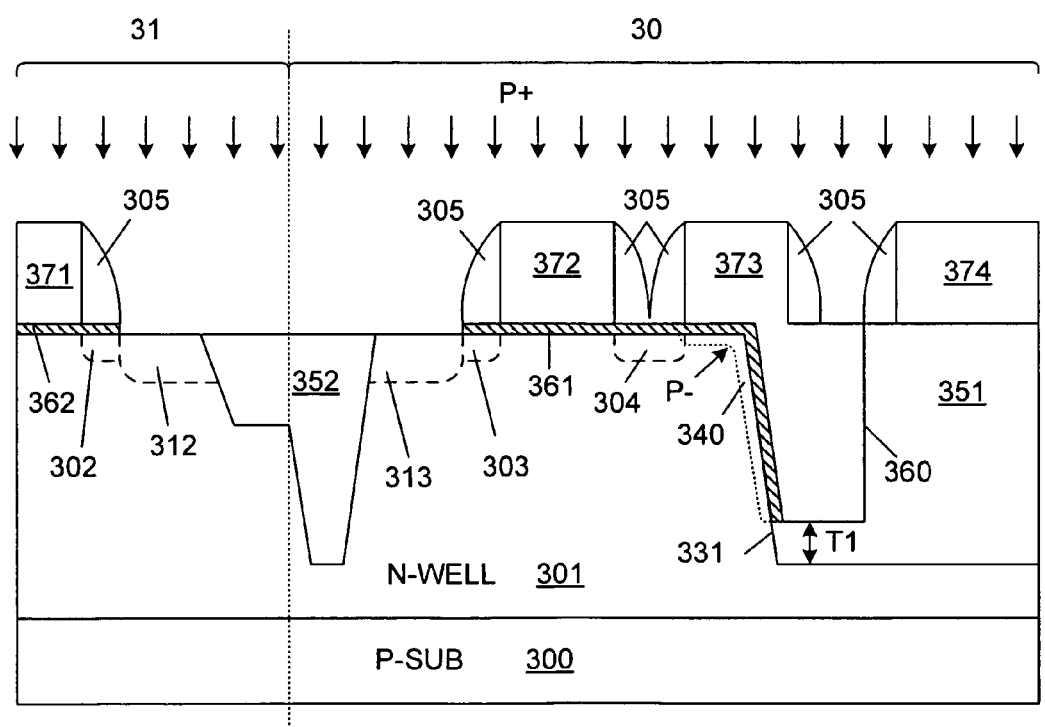
Figure 3M:
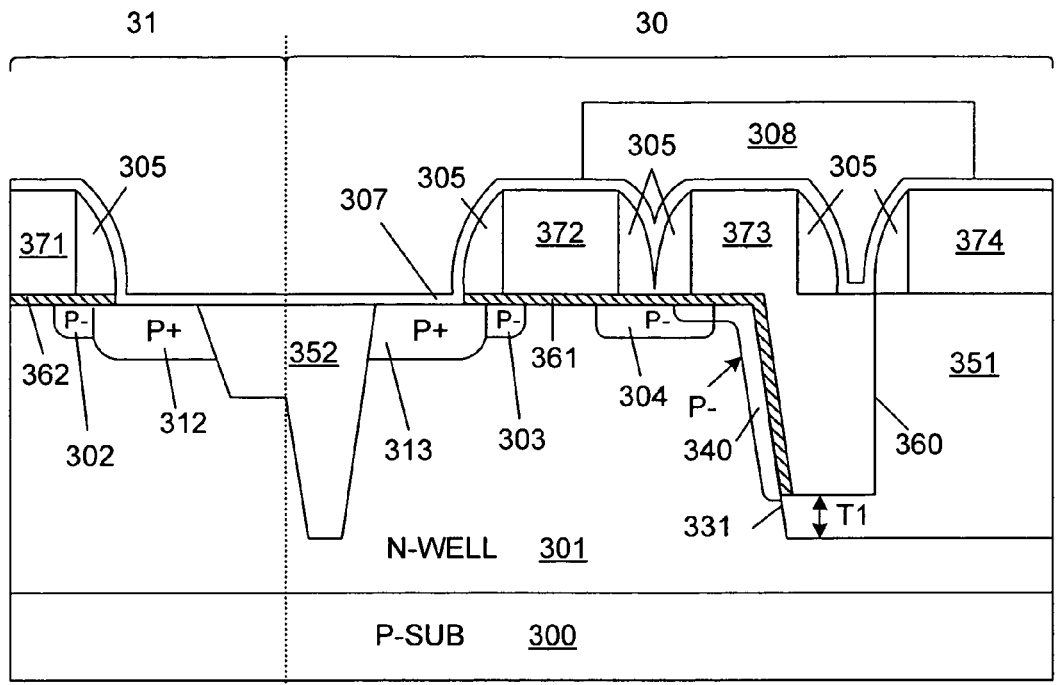
Figure 3N:
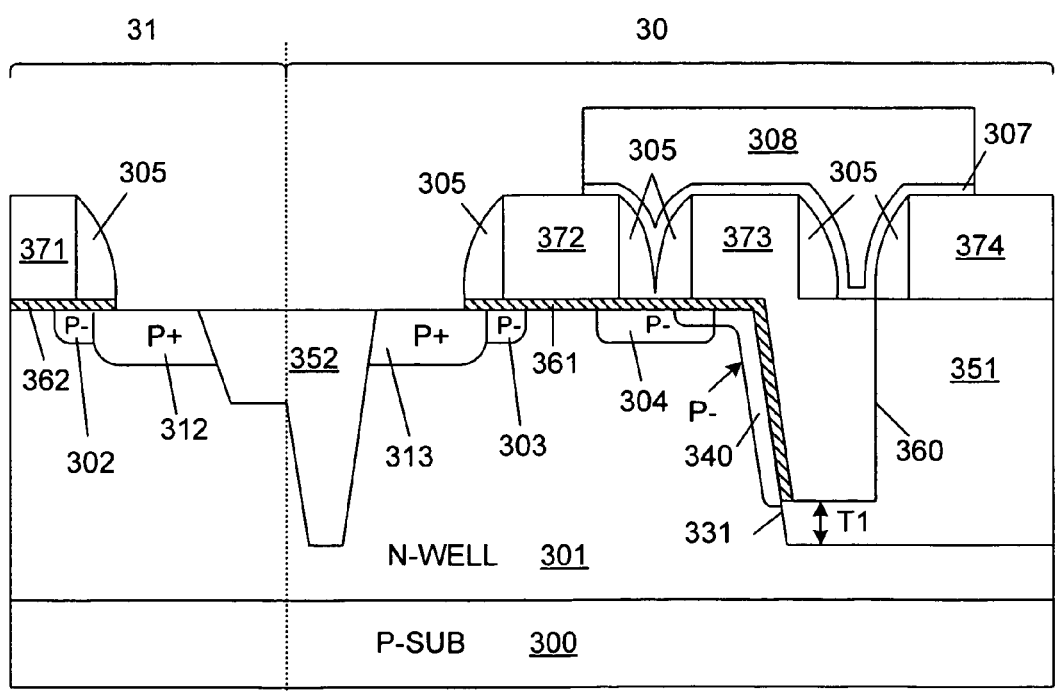
Figure 3O:
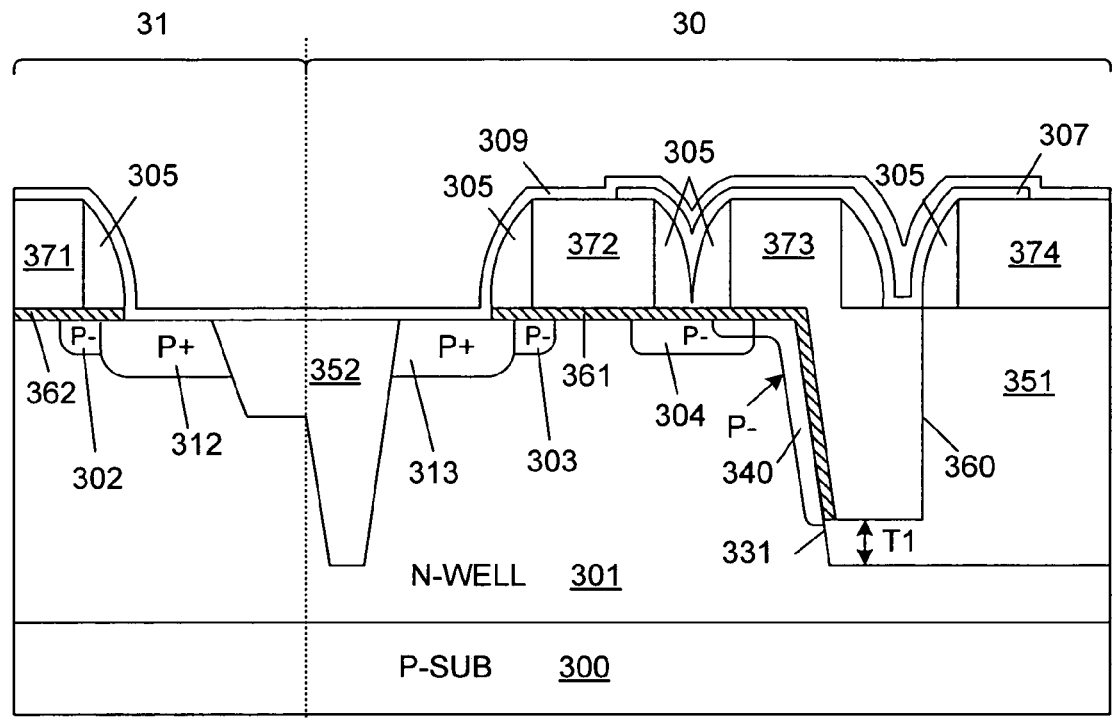
Figure 3P:
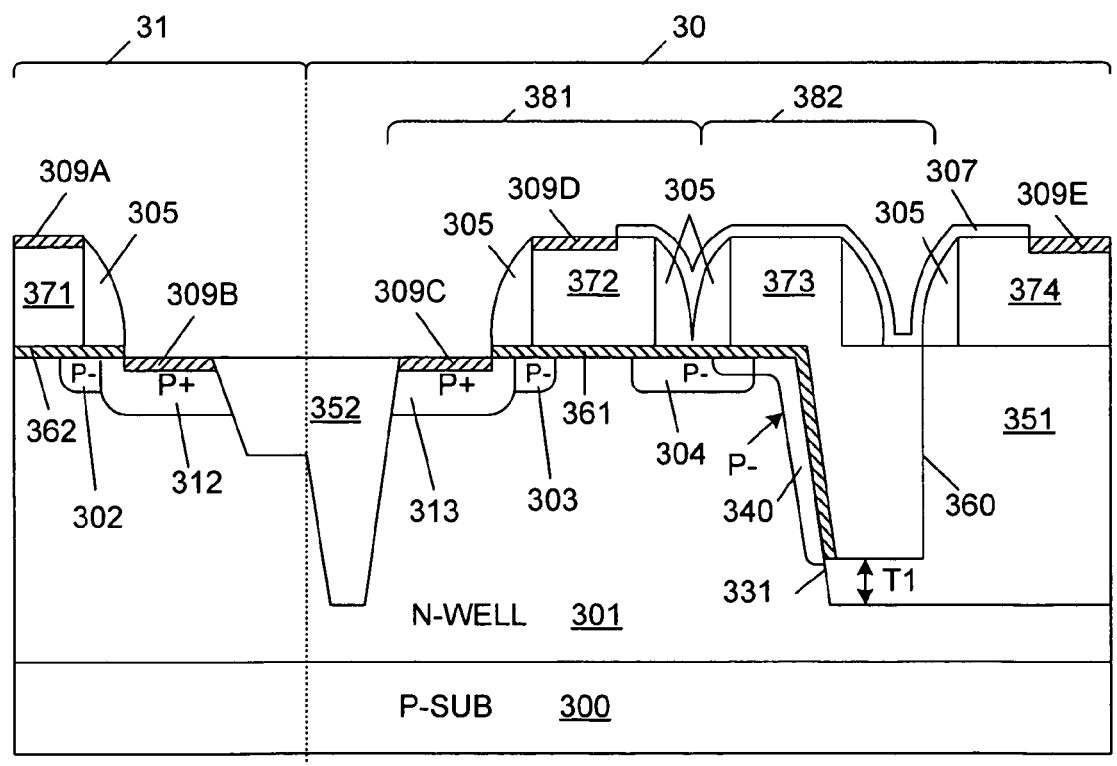

FIGS. 3A-3P are cross sectional views of a DRAM cell and a conventional logic transistor during various states of fabrication in accordance with one embodiment of the present invention.

FIG. 3A shows a p-type semiconductor substrate 300, which is separated into DRAM cell array region 30 and logic device region 31. Logic device region 31 is designated as all area in the non-memory part of the integrated circuit, as well as the area of the DRAM memory circuitry that does not include the DRAM cell array. In the described example, substrate 300 has a <1,0,0> crystalline orientation and a dopant concentration of about $1 \times 10^{16}/cm^3$. Other crystal orientations and concentrations can be used in other embodiments of the invention. In addition, the conductivity types of the various regions can be reversed in other embodiments with similar results.

A hard mask layer 320, for example silicon nitride is formed over substrate 300. A photoresist layer 321 is then deposited over hard mask film 320. This photoresist layer 321 is exposed and developed, thereby creating openings 322-323. These openings 322-323 define the locations of subsequently formed memory area isolation regions. An etch is performed through openings 322-323, thereby forming corresponding openings 324-325 through the exposed portions of hard mask layer 320 (FIG. 3B). Photoresist layer 321 is then stripped.

As shown in FIG. 3B, after photoresist layer 321 has been stripped, an initial trench etch is performed through the openings 324-325 in hard mask layer 320. This etch forms initial trenches 331-332, each having an intermediate depth equal to $D_{INT}$. As described below, these intermediate depth trenches 331-332 are subsequently made deeper and filled with a dielectric material to implement memory area silicon isolation.

As shown in FIG. 3C, a photoresist layer 335 is formed over the resulting structure. Photoresist layer 335 is exposed and developed to form opening 336. Opening 336, which is aligned with an edge of intermediate depth trench 332, exposes a portion of the underlying hard mask layer 320. An etch is performed through opening 2311, thereby forming an opening 337 through the exposed portion of hard mask layer 320.

Photoresist layer 335 is then stripped, and a conventional shallow trench isolation (STI) etch is performed through hard mask layer 320 to a depth of $D_{STI}$. At this time, intermediate depth trenches 331-332 are made deeper by an amount approximately equal to $D_{STI}$, thereby forming deep trenches 341-342. These deep trenches 341-342 have a depth $D_{DTI}$, which is approximately equal to $D_{INT}+D_{STI}$. Shallow trench 343, having a depth of $D_{STI}$, is formed in the location previously defined by opening 336 of photoresist mask 335. In the described embodiment, the crystalline structure of substrate 300 causes the sidewalls of trenches 341-343 to exhibit angles of about 80 degrees.

In another embodiment of a present invention, completely separate lithography and etch steps can be used to define shallow trench 343 and deep trenches 341-342.

As shown in FIG. 3E, a dielectric layer 345, such as silicon oxide, is then deposited over the resulting structure, thereby filling trenches 341-343 and covering hard mask layer 320. A chemical-mechanical-polishing (CMP) planarization step is then performed to planarize dielectric layer 345, with hard mask layer 320 acting as a stopper layer, in a manner consistent with manufacturing of shallow-trench-isolation (STI) in a conventional logic process. As shown in FIG. 3F, at the end of the CMP planarization step, the upper surfaces of the dielectric layer 345 are substantially co-planar with the upper surface of substrate 300. The portion of dielectric layer 345 remaining in deep trench 341 is labeled as dielectric region 351. The portion of dielectric layer 345 remaining in deep and shallow trenches 342 and 343 is labeled as dielectric region 352.

Sacrificial oxidations and well and threshold voltage adjust implants are then performed in a manner consistent with the conventional logic process, notably forming N-well 301 of the DRAM array. In one embodiment, N-well 301 is formed by a conventional process step such as ion implantation, and has a dopant concentration of about $1 \times 10^{17}/cm^3$. Although no logic regions outside of N-well 301 are shown in FIG. 3F, the existence of such regions is evident to one of ordinary skill in the art. In another embodiment of the present invention, the DRAM cell array can be fabricated in a P-type triple-well and employ NMOS transistors. In this case, a deep N-type well and a triple P-type well are fabricated in place of N-well 301.

Turning now to FIG. 3G, buffer oxide layer 355 is either retained from the STI processing step or thermally grown over the upper surface of the resulting structure. In the described embodiment, oxide layer 355 is silicon oxide having a thickness in the range of about 5 to 20 nm. However, this thickness can vary depending on the process being used.

Photoresist mask 356, having opening 357, is formed over buffer oxide layer 355 using well known processing techniques. Opening 357 is located partially over n-well 301 and partially over field dielectric region 351.

As illustrated in FIG. 3G, an etch is performed through the opening 357 of photoresist mask 356, thereby removing the exposed portion of oxide layer 355. The etch also removes an exposed portion of dielectric region 351, thereby creating a cavity 360 in dielectric region 351. At the end of the etch, dielectric region 351 has a thickness T1 under cavity 360 in the range of about 50 to 200 nm. This thickness T1 is selected to be thick enough to isolate adjacent DRAM cells in memory array region 30. The etchant is highly selective to silicon, such that n-type well 301 is not substantially removed during the etch. In one embodiment, this etch is a timed etch.

As illustrated by FIG. 3G, an optional p– type ion implant is performed through opening 357 of photoresist mask 356. In one embodiment, boron is implanted at a dosage of $2 \times 10^{13}/cm^2$ and an energy of 10-15 KeV. The p– type implant results in the formation of P– capacitor inversion region 340. Capacitor region 340 makes the threshold voltage under the subsequently formed capacitor structure more positive, such that the capacitor structure can be turned on more easily. That is, P– inversion layer 340 helps to invert the substrate adjacent to the cell capacitor electrode and boost performance of the resulting DRAM cell. In the embodiment where a triple-P-well structure is used in place of N-well 301, the P– implant is replaced with an N– implant, thereby resulting in an N– inversion layer. In another embodiment, an inversion layer is formed by applying appropriate bias to the gate of the MOS cell capacitor.

As illustrated in FIG. 3H, photoresist mask 356 and buffer oxide layer 355 are stripped, and gate dielectric layers 361 and 362 are then formed over the upper surface of the resulting structure. In the described embodiment, gate dielectric layers 361 and 362 are thermally grown silicon oxide having a thickness in the range of about 1.5 to 5 nm. However, this thickness can vary depending on the process being used. In the described embodiment, the same gate dielectric layer 361 is used for both the gate oxide of the access transistor and the dielectric layer of the cell capacitor. However, in other embodiments, different layers can be used to form the gate dielectric layer and the capacitor dielectric layer. For example, the capacitor dielectric layer can be fabricated to be thicker than the gate dielectric layer. In another example, the capacitor dielectric layer can be formed from silicon nitride or a combination of silicon oxide and silicon nitride, while the dielectric layer is formed only from silicon oxide. The gate dielectric layers 361 and 362 can either be identical, or different in thickness and/or composition.

From this point forward, the conventional logic process is resumed. As shown in FIG. 3I, a layer of polycrystalline silicon 363 having a thickness in the range of about 100 to 300 nm is deposited over the resulting structure. Polysilicon layer 363 substantially fills cavity 360. Photoresist mask 364 is formed over polysilicon layer 363. As will become apparent in view of the following description, photoresist mask 364 defines the gate electrode of the access transistor, an electrode of the cell capacitor, a gate electrode of a logic transistor, and a conductive element in the memory array region 30.

As illustrated in FIG. 3J, polysilicon layer 363 is etched through photoresist mask 364, thereby forming logic gate electrode 371, memory access gate electrode 372, capacitor electrode 373 and memory array conductor 374. A portion of capacitor electrode 373 remains in cavity 360. By forming portions of capacitor electrode 360 on the sidewall of cavity 360, the area of incidence between capacitor electrode 373 and capacitor region 340 (i.e., the area of the capacitor) is made relatively large, while the required layout area of capacitor electrode 373 is made relatively small.

As illustrated in FIG. 3K, photoresist mask 364 is stripped, and a p– type ion implant is performed onto the resulting structure. As a result, lightly doped p– type source/drain regions 302-304 are formed in n-well 301. P-type source/drain region 304 is continuous with capacitor region 340. In addition, polysilicon regions 371-374 receive p-type impurities during this implant.

As illustrated in FIG. 3L, sidewall spacers 305 are formed on the resulting structure. Sidewall spacers 305 are formed using a conventional fabrication process. For example, sidewall spacers 305 can be formed by depositing a silicon nitride layer over the resulting structure, an then performing an anisotropic etch on the silicon nitride layer using conventional processing techniques. After the anisotropic etch is complete, silicon nitride spacers 305 remain.

After silicon nitride sidewall spacers 305 have been formed, a P+ photoresist mask (not shown) is formed to define the locations of the desired P+ regions on the chip. A P+ type ion implant is then performed, thereby forming P+ source/drain regions 312 and 313 (as well as the other desired P+ regions on the substrate). The P+ type ion implant further dopes polysilicon regions 371-373. Sidewall spacers 305 prevent the P+ impurity from being implanted in lightly doped source/drain region 304. Optionally, the P+ photoresist mask (not shown) can include a portion that prevents the P+ impurity from being implanted into lightly doped source/drain region 304. An annealing thermal cycle is subsequently performed to activate the implanted impurities in regions 302-304, 312-313 and 340.

Turning now to FIG. 3M, a salicide-blocking dielectric layer 307 (e.g., silicon oxide) is deposited over the resulting structure. A salicide-blocking photoresist mask 308 is formed over dielectric layer 307. Mask 308 is patterned to expose gate electrode 371, p+ type source/drain regions 312-313, a portion of gate electrode 372, and a portion of conductive element 374.

As shown in FIG. 3N, dielectric layer 307 is etched, thereby removing the portions of dielectric layer 307 exposed by mask 308. More specifically, polysilicon gate electrode 317, p+ source/drain regions 312-313, the left portion of polysilicon gate electrode layer 372, and the right portion of polysilicon region 374 are exposed.

As illustrated in FIG. 3O, mask 308 is stripped and a refractory metal layer 309, such as titanium or cobalt, is deposited over the resulting structure. In the described embodiment, titanium is deposited to a thickness of about 30 nm. An anneal is subsequently performed, thereby causing the refractory metal layer 309 to react with underlying silicon regions to form metal silicide regions. In FIG. 3O, the only silicon regions underlying refractory metal layer 309 are gate electrode 371, the p+ source/drain regions 312-313, the left portion of polysilicon gate electrode 372, and the right portion of polysilicon conductive element 374.

The unreacted portions of refractory metal layer 309 are then removed, as illustrated in FIG. 3P. Metal silicide regions 309A, 309B, 309C, 309D and 309E are formed over gate electrode 371, p+ source/drain regions 312 and 313, the left portion of polysilicon gate electrode 372 and the right portion of polysilicon conductive element 374, respectively. It is preferable to block silicide formation from areas where leakage current should be minimized, namely, source/drain region 304 and optionally, polysilicon capacitor electrode 373. Note that dielectric layer 307 prevents silicide from being formed in these locations.

Finally, the standard logic backend process well known to one skilled in the art, consisting of contact, metal, and via formations, is performed and completes the process of fabrication of embedded DRAM integrated circuit.

The resulting DRAM cell is illustrated in FIG. 3P. The access transistor of this DRAM cell is located in region 381, and the cell capacitor structure of this DRAM cell is located in region 382. The capacitor structure has a relatively large surface area because the capacitor structure is formed in cavity 360 in dielectric region 351. This relatively large surface area results in a relatively large capacitance for the capacitor structure. However, the capacitor structure consumes a relatively small layout area because the capacitor structure is formed partially in cavity 360. Advantageously, this DRAM cell can be fabricated by making small modifications to a conventional logic process. More specifically, the masking step and etch of cavity 360 and the optional p– ion implant of FIG. 3G are added to a conventional logic process to implement a 1T-SRAM-Q process. The masking step and etch used to create the additional depth of the DTI trenches are added to the 1T-SRAM-Q process to implement the process of the present invention.

Figure 3Q:
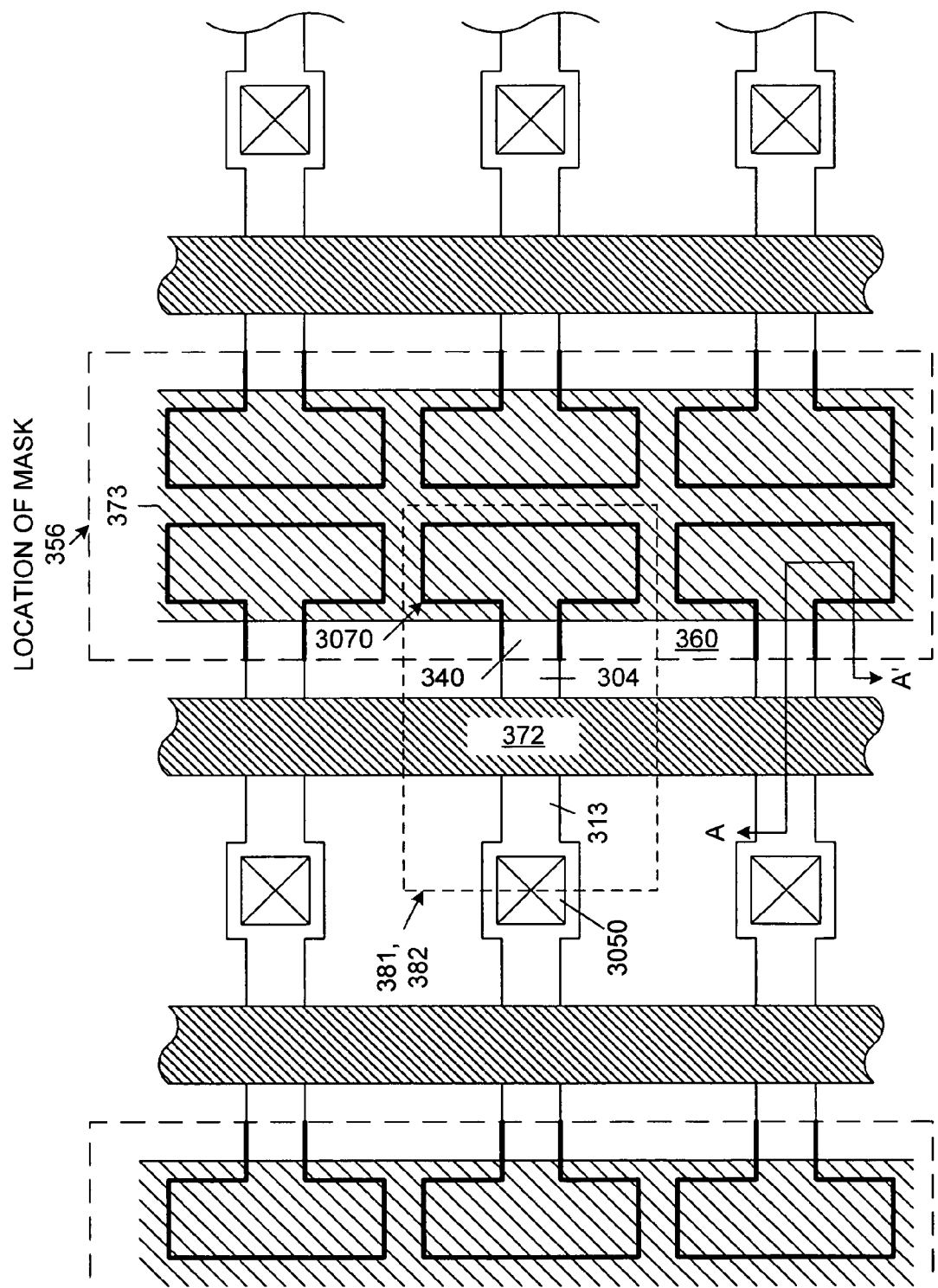

FIG. 3Q is a top view of an array of DRAM cells, including the DRAM cell of FIG. 3P. Note that the view illustrated by regions 381 and 382 of FIG. 3P roughly corresponds with the view defined by section line A-A' of FIG. 3Q. Contacts, which provide connections between the drain of an access transistor and a bit line, are illustrated as boxes containing X's in FIG. 3Q. Thus, contact 3050 provides a connection from source/drain region 313 to a bit line (not shown). Contact 3050 also provides a connection to the drain region of a symmetric DRAM cell located to the left of the present DRAM cell. In this manner, one contact provides a connection to two DRAM cells in an array.

Source/drain region 313 and source/drain region 304 are separated by gate electrode 372. The location of mask 356, which defines the boundary of capacitor region 340, is illustrated in FIG. 3Q. Heavy line 3070, which has a hammerhead shape, defines the sidewall of cavity 360. Cavity 360 is located outside of hammerhead-shaped line 3070, but within the boundary defined by mask 356. Thus, the portion of capacitor electrode 373 located inside of the hammerhead-shaped line 3070 is located at a higher elevation than the portion of capacitor electrode 373 located outside of hammerhead-shaped line 3070. The area of capacitor electrode 373 is maximized by extending over the sidewall defined by line 3070. Note that capacitor electrode 373 extends to adjacent DRAM cells in FIG. 3Q.

Figure 4A:
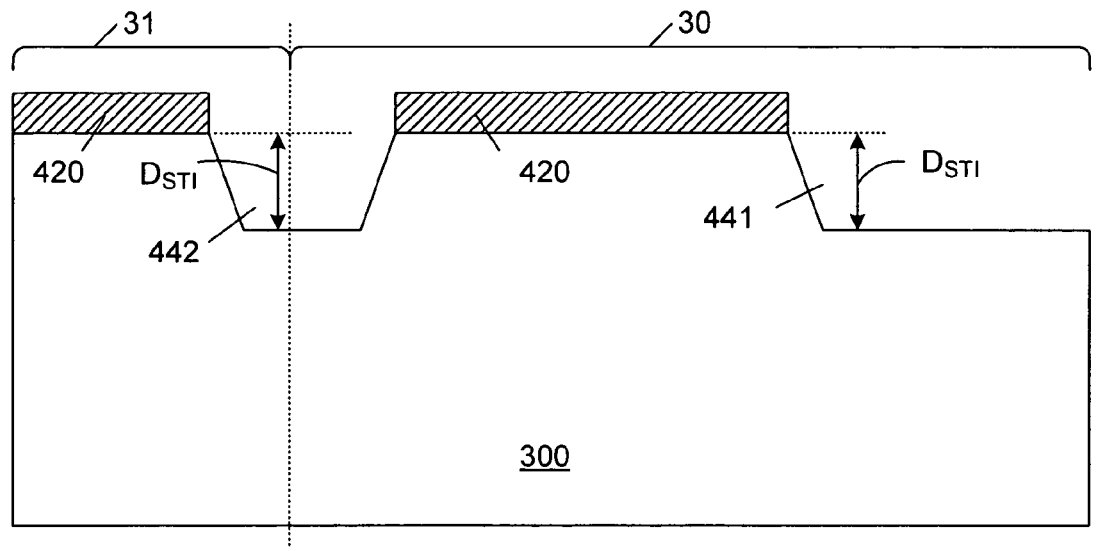
FIGS. 4A and 4B are cross sectional views illustrating an alternate method for forming shallow and deep isolation trenches in accordance with the present invention.
Figure 4B:
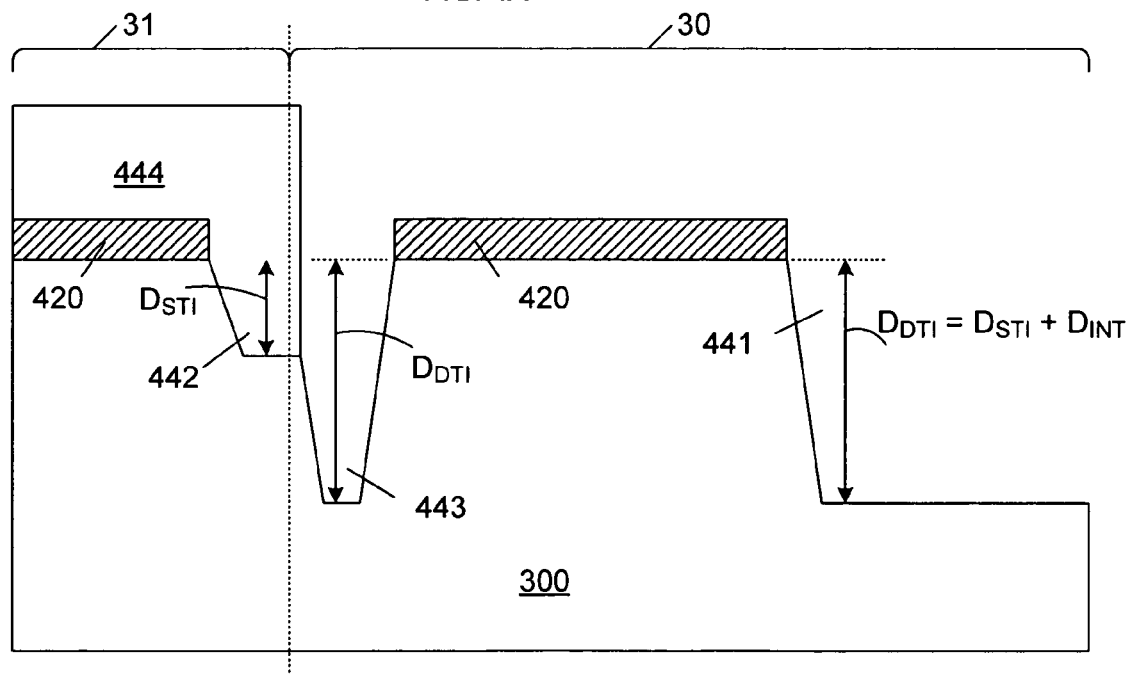

FIGS. 4A and 4B are cross sectional views illustrating an alternate method for forming the desired shallow and deep trenches of the present invention.

As shown in FIG. 4A, a silicon nitride hard mask layer 420 is formed over substrate 300. Hard mask layer 420 generally has the same dimension as hard mask layer 320, as presented above in connections with FIGS. 3C and 3D. A shallow trench isolation etch is performed through hard mask layer 420, thereby forming shallow trench regions 441 and 442. Shallow trench regions 441 and 442 have a depth of $D_{STI}$.

As shown in FIG. 4B, a photoresist mask 444 is formed over the resulting structure. Photoresist mask 444 covers those regions where shallow trenches are to be formed, and exposes those regions where deep trenches are to be formed. An intermediate depth etch is performed through photoresist mask 444, thereby extending shallow trench region 441 (hereinafter deep trench region 441) and the exposed portion of shallow trench region 442 (hereinafter deep trench region 443) to a depth of $D_{DTI}$. Note that the intermediate depth etch is performed to a depth equal to $D_{DTI}-D_{STI}$. Photoresist mask 444 is then stripped, and processing continues in the manner described in connection with FIGS. 3E-3P above.

Figure 5A:
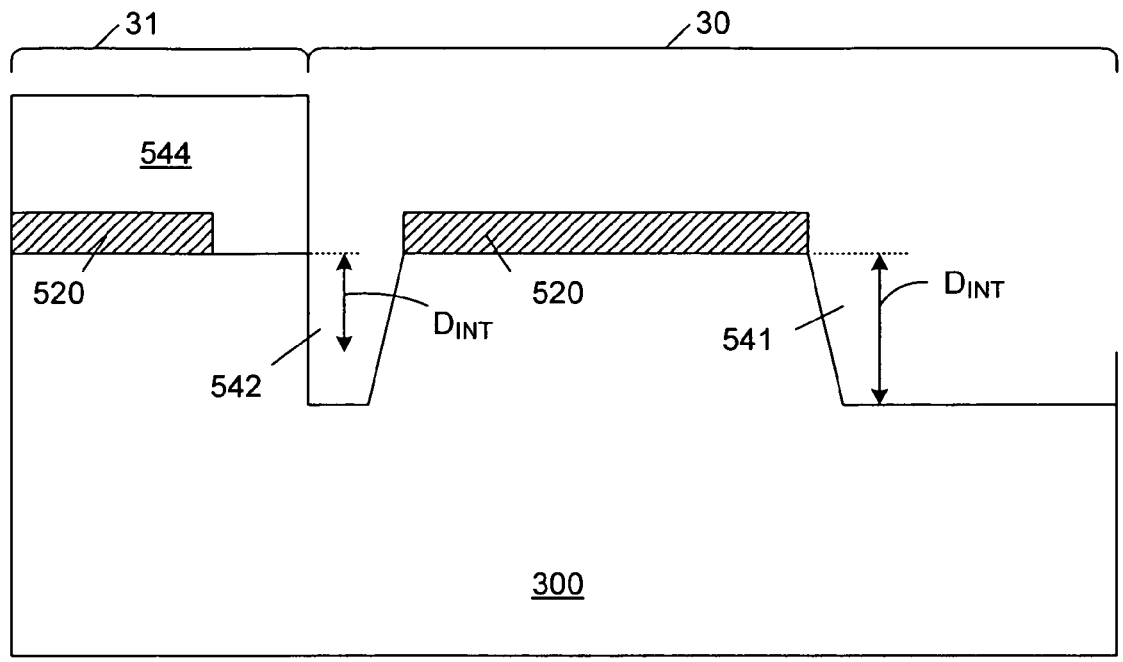
FIGS. 5A and 5B are cross sectional views illustrating an alternate method for forming the desired shallow and deep trenches of the present invention.
Figure 5B:
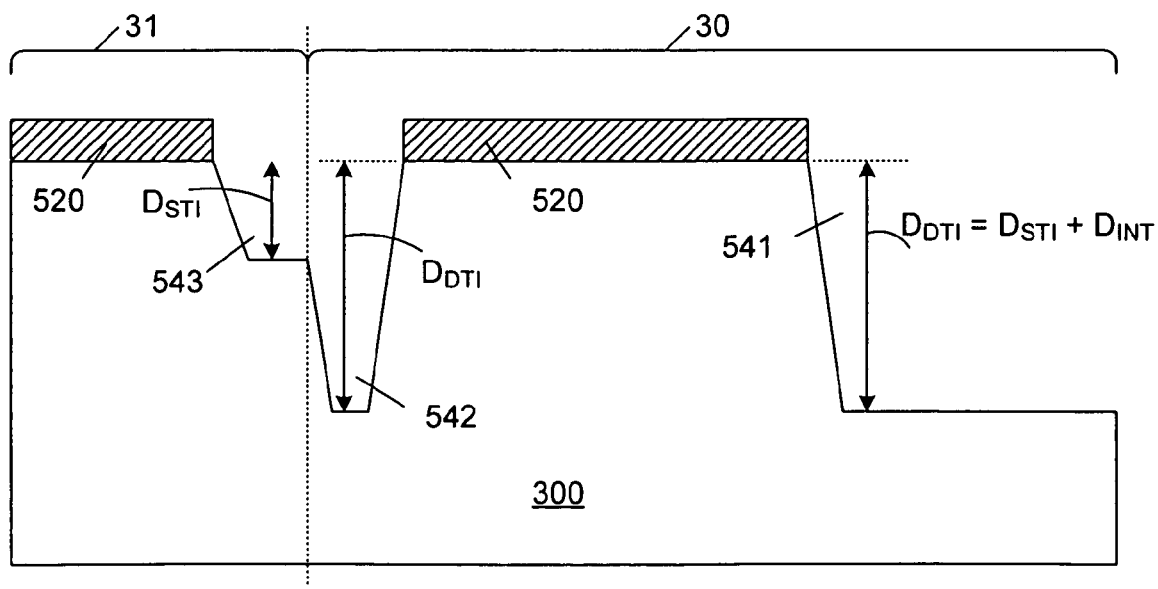

FIGS. 5A and 5B are cross sectional views illustrating an alternate method for forming the desired shallow and deep trenches of the present invention.

As shown in FIG. 5A, a silicon nitride hard mask layer 520 is formed over substrate 300. Hard mask layer 520 generally has the same dimension as hard mask layer 320, as presented above in connections with FIGS. 3C and 3D. A photoresist mask 544 is formed over the resulting structure. Photoresist mask 544 covers those regions where shallow trenches are to be formed, and exposes those regions where deep trenches are to be formed. An intermediate depth etch is performed through photoresist mask 544 and hard mask layer 520, thereby forming intermediate depth trenches 541 and 542. Note that the intermediate depth etch is performed to a depth equal to $D_{DTI}-D_{STI}$.

As illustrated in FIG. 5B, photoresist mask 544 is then stripped, and a shallow trench isolation etch is performed through hard mask layer 520, thereby forming shallow trench region 543. Shallow trench region 543 has a depth of $D_{STI}$. The shallow trench isolation etch also extends the intermediate depth trenches 541 and 542 (hereinafter deep trench regions 541 and 542), to a depth of $D_{DTI}$. Processing then continues in the manner described above in connection with FIGS. 3E-3P.

Although the invention has been described in connection with several embodiments, it is understood that this invention is not limited to the embodiments disclosed, but is capable of various modifications which would be apparent to a person skilled in the art. Thus, the invention is limited only by the following claims.

We claim:

1. A method of forming an embedded DRAM system including DRAM cells and logic transistors on the same semiconductor substrate, each of the DRAM cells having an access transistor and a capacitor structure, the method comprising of:
    forming a first cavity having a first depth in a first region of the semiconductor substrate;
    forming a second cavity having a second depth in a second region of the semiconductor substrate, wherein the second cavity is deeper than the first cavity;
    forming a first dielectric region in the first cavity and a second dielectric region in the second cavity;
    etching a portion of the second dielectric region to create a third cavity that exposes a sidewall of the second cavity;
    forming a first dielectric layer over the upper surface of the semiconductor substrate and the exposed sidewall of the second cavity;
    forming a second dielectric layer over the upper surface of the semiconductor substrate;
    forming an electrode layer over the first dielectric layer and the second dielectric layer; and
    patterning the electrode layer to form a capacitor electrode of the capacitor structure and a gate electrode of the access transistor, wherein the capacitor electrode is located over the first dielectric layer, and extends over the upper surface of the semiconductor substrate and the sidewall of the second cavity, the capacitor electrode being at least partially located in the third cavity, and wherein the gate electrode is located over the second dielectric layer.

2. The method of claim 1, further comprising:
    patterning the electrode layer to form a gate electrode of a logic transistor over the second dielectric layer.

3. The method of claim 2, wherein the second dielectric layer has a different composition or thickness than the first dielectric layer.

4. The method of claim 1, wherein the second dielectric layer has a different composition or thickness than the first dielectric layer.

5. The method of claim 1, wherein the step of forming the third cavity further comprises:
    forming a mask having an opening located over the sidewall portion of the second cavity in the semiconductor substrate; and
    etching the second dielectric region through the opening of the mask, thereby forming the third cavity.

6. The method of claim 5, further comprising implanting an impurity through the mask into the semiconductor substrate, wherein the impurity adjusts a threshold voltage of the capacitor structure or inverts the polarity of the semiconductor substrate adjacent to the first dielectric layer.

7. A method of forming an embedded DRAM system including DRAM cells and logic transistors on the same semiconductor substrate, each of the DRAM cells having an access transistor and a capacitor structure, the method comprising of:
    forming a first cavity having a first depth in a first region of the semiconductor substrate;
    forming a second cavity having a second depth in a second region of the semiconductor substrate, wherein the second cavity is deeper than the first cavity;
    forming a first dielectric region in the first cavity and a second dielectric region in the second cavity;
    etching a portion of the second dielectric region to create a third cavity that exposes a sidewall of the second cavity;
    forming a first dielectric layer over the upper surface of the semiconductor substrate and the exposed sidewall of the second cavity;
    forming an electrode layer over the first dielectric layer;
    patterning the electrode layer to form a capacitor electrode of the capacitor structure, and a gate electrode of an access transistor of the DRAM cells, wherein the capacitor electrode extends over the upper surface of the semiconductor substrate and the sidewall of the second cavity, the capacitor electrode being at least partially located in the third cavity;
    performing an implant after forming the gate electrode and the capacitor electrode, the implant forming a lightly-doped source/drain region between the gate electrode and the capacitor electrode;
    forming metal silicide over the gate electrode; and
    preventing metal silicide from being formed over the lightly doped source/drain region.

8. A method of forming an embedded DRAM system including DRAM cells and logic transistors on the same semiconductor substrate, each of the DRAM cells having an access transistor and a capacitor structure, the method comprising of:
    forming a first cavity having a first depth in a first region of the semiconductor substrate;
    forming a second cavity having a second depth in a second region of the semiconductor substrate, wherein the second cavity is deeper than the first cavity;
    forming a first dielectric region in the first cavity and a second dielectric region in the second cavity;
    etching a portion of the second dielectric region to create a third cavity that exposes a sidewall of the second cavity;
    forming a first dielectric layer over the upper surface of the semiconductor substrate and the exposed sidewall of the second cavity;
    forming an electrode layer over the first dielectric layer;
    patterning the electrode layer to form a capacitor electrode of the capacitor structure, and a gate electrode of an access transistor of the DRAM cells, wherein the capacitor electrode extends over the upper surface of the semiconductor substrate and the sidewall of the second cavity, the capacitor electrode being at least partially located in the third cavity;
    performing an implant after forming the gate electrode and the capacitor electrode, the implant forming a lightly-doped source/drain region between the gate electrode and the capacitor electrode;
    forming metal silicide over the gate electrode; and
    preventing metal silicide from being formed over the capacitor electrode.

9. A method of forming an embedded DRAM system including DRAM cells and logic transistors on the same semiconductor substrate, each of the DRAM cells having an access transistor and a capacitor structure, the method comprising of:

forming a first cavity having a first depth in a first region of the semiconductor substrate;

forming a second cavity having a second depth in a second region of the semiconductor substrate, wherein the second cavity is deeper than the first cavity;

forming a first dielectric region in the first cavity and a second dielectric region in the second cavity;

etching a portion of the second dielectric region to create a third cavity that exposes a sidewall of the second cavity;

forming a first dielectric layer over the upper surface of the semiconductor substrate and the exposed sidewall of the second cavity;

forming an electrode layer over the first dielectric layer;

patterning the electrode layer to form a capacitor electrode of the capacitor structure, and a gate electrode of an access transistor of the DRAM cells, wherein the capacitor electrode extends over the upper surface of the semiconductor substrate and the sidewall of the second cavity, the capacitor electrode being at least partially located in the third cavity;

performing an implant after forming the gate electrode and the capacitor electrode, the implant forming a lightly-doped source/drain region between the gate electrode and the capacitor electrode; and forming sidewall spacers adjacent to the gate electrode and the capacitor electrode, wherein the sidewall spacers completely cover the lightly doped source/drain region.

10. The method of claim 1, further comprising implanting impurities into the electrode layer.

11. A method of forming an embedded DRAM system including DRAM cells and logic transistors, each of the DRAM cells having an access transistor and a capacitor structure, the method comprising the steps of:

fabricating dynamic random access memory (DRAM) cells in a memory array region of a semiconductor substrate;

fabricating logic transistors in a logic region of the semiconductor substrate;

forming shallow trench isolation regions below an upper surface of the semiconductor substrate in the logic region of the semiconductor substrate; and forming deep trench isolation regions below an upper surface of the semiconductor substrate in the memory region of the semiconductor substrate, wherein the deep trench isolation regions are deeper than the shallow trench isolation regions, wherein the steps of forming the shallow trench isolation regions and the deep trench isolation regions comprise:

forming a first mask which exposes regions of the substrate where the deep trench isolation regions are to be formed;

performing a first etch through the first mask;

removing one or more portions of the first mask, thereby forming a modified first mask, wherein the one or more portions removed from the first mask expose regions where the shallow trench isolation regions are to be formed; and performing a second etch through the modified first mask.

12. The method of claim 11, wherein the second etch forms shallow trench regions, and the first and second etches combine to form deep trench regions, the method further comprising depositing a dielectric material over the semiconductor substrate, wherein the dielectric material fills the shallow trench regions and the deep trench regions.

13. The method of claim 12, further comprising planarizing the dielectric material, such that the dielectric material remains only in the shallow trench regions and the deep trench regions.

14. The method of claim 13, further comprising:

etching a cavity in the dielectric material present in one of the deep trench regions, thereby exposing a sidewall of the deep trench region;

forming a dielectric layer over the sidewall of the deep trench region; and depositing conductive material in the cavity in the dielectric material, wherein the conductive material is formed over the dielectric layer.

15. The method of claim 14, further comprising implanting a dopant into the exposed sidewall of the deep trench region.

16. A method of forming an embedded DRAM system including DRAM cells and logic transistors, each of the DRAM cells having an access transistor and a capacitor structure, the method comprising the steps of:

fabricating dynamic random access memory (DRAM) cells in a memory array region of a semiconductor substrate;

fabricating logic transistors in a logic region of the semiconductor substrate;

forming shallow trench isolation regions below an upper surface of the semiconductor substrate in the logic region of the semiconductor substrate; and forming deep trench isolation regions below an upper surface of the semiconductor substrate in the memory region of the semiconductor substrate, wherein the deep trench isolation regions are deeper than the shallow trench isolation regions, wherein the steps of forming the shallow trench isolation regions and the deep trench isolation regions comprise:

forming a first mask which exposes regions of the substrate where the deep trench isolation regions are to be formed;

performing a first etch through the first mask, thereby creating deep trench regions in the substrate;

depositing a first dielectric layer over the semiconductor substrate, wherein the first dielectric layer fills the deep trench regions and extends over the upper surface of the substrate;

planarizing the first dielectric layer, such that portions of the first dielectric layer located over the upper surface of the substrate are removed;

forming a second mask which exposes regions of the substrate where the shallow trench isolation regions are to be formed;

performing a second etch through the second mask, thereby creating shallow trench regions in the substrate;

depositing a second dielectric layer over the semiconductor substrate, wherein the second dielectric layer fills the shallow trench regions and extends over the upper surface of the substrate; and planarizing the second dielectric layer, such that portions of the second dielectric layer located over the upper surface of the substrate are removed.

17. The method of claim 16, wherein the shallow trench isolation regions are formed before the deep trench isolation regions.

* * * * *

UNITED STATES PATENT AND TRADEMARK OFFICE
CERTIFICATE OF CORRECTION

PATENT NO. : 7,323,379 B2
APPLICATION NO. : 11/050988
DATED : January 29, 2008
INVENTOR(S) : Dennis Sinitsky et al.

Page 1 of 1

It is certified that error appears in the above-identified patent and that said Letters Patent is hereby corrected as shown below:

Column 3, line 15, amend "deposted" to -- deposited --.

Column 8, line 36, amend "connections" to -- connection --.

Signed and Sealed this

Twenty-ninth Day of July, 2008

JON W. DUDAS
*Director of the United States Patent and Trademark Office*